United States Patent [19]
Yamamoto et al.

[11] Patent Number: 5,548,246
[45] Date of Patent: Aug. 20, 1996

[54] POWER AMPLIFIER INCLUDING AN IMPEDANCE MATCHING CIRCUIT AND A SWITCH FET

[75] Inventors: Kazuya Yamamoto; Noriyuki Tanino; Tetsuya Umemoto, all of Itami, Japan

[73] Assignee: Mitsubishi Denki Kabushiki Kaisha, Tokyo, Japan

[21] Appl. No.: 438,472

[22] Filed: May 10, 1995

[30] Foreign Application Priority Data

Jun. 9, 1994 [JP] Japan .................................. 6-127266

[51] Int. Cl.$^6$ .................... H03F 1/14; H03F 3/16; H03F 3/68; H03F 3/191
[52] U.S. Cl. .................. 330/51; 330/277; 330/295; 330/302
[58] Field of Search ................... 330/51, 124 D, 330/124 R, 129, 278, 295, 302, 277

[56] References Cited

U.S. PATENT DOCUMENTS 4,598,252 7/1986 Andricos ................................ 330/51

FOREIGN PATENT DOCUMENTS 60-193369 3/1984 Japan .

OTHER PUBLICATIONS

Muraguchi et al, "A UHF–Band High–Efficiency Variable Gain Power Amplifier", Society of Electronic Information Communication, Autumn Meeting, 1993, pp. 2–402.

Primary Examiner—Steven Mottola
Attorney, Agent, or Firm—Leydig, Voit & Mayer

[57] ABSTRACT

A power amplifier comprises opposite input and output terminals, a first amplifier circuit connected between the input terminal and the output terminal and comprising a first amplifier FET and a first matching circuit, and a second amplifier circuit connected between the input terminal and the output terminal and comprising a second amplifier FET, a second matching circuit, and a switching circuit. In this power amplifier, the first amplifier circuit outputs an output signal of a first power level when the first amplifier FET is operated while the second amplifier FET is not operated and the switching circuit is turned off, and the second amplifier circuit outputs an output signal of a second power level when the first amplifier FET is not operated while the second amplifier FET is operated and the switching circuit is turned on. Therefore, impedances of the output side matching circuits of the first and second amplifier circuits which output amplified signals of different power levels can be optimized with high precision. As the result, in both the high-power output operation and the low-power output operation, the efficiencies of the first and second amplifier circuits are significantly improved.

7 Claims, 10 Drawing Sheets

POWER AMPLIFIER INCLUDING AN IMPEDANCE MATCHING CIRCUIT AND A SWITCH FET

FIELD OF THE INVENTION

The present invention relates to power amplifiers and, more particularly, to an improvement in efficiency of a power amplifier used in a transmitter of a portable telephone.

BACKGROUND OF THE INVENTION

In recent years, with the spread of portable telephones, mobile communication systems utilizing analog or digital modulation have been extensively developed. Since portable telephones use batteries as power sources, reduction of power consumption is very important for long-time operation. In a portable telephone, a power amplifier amplifies a signal amplitude to an antenna output, and the power consumption of the power amplifier amounts to 70–80 % of the total power consumption of the portable telephone. Therefore, it is very important for the reduction in the power consumption to increase the efficiency of the power amplifier.

Figure 13:
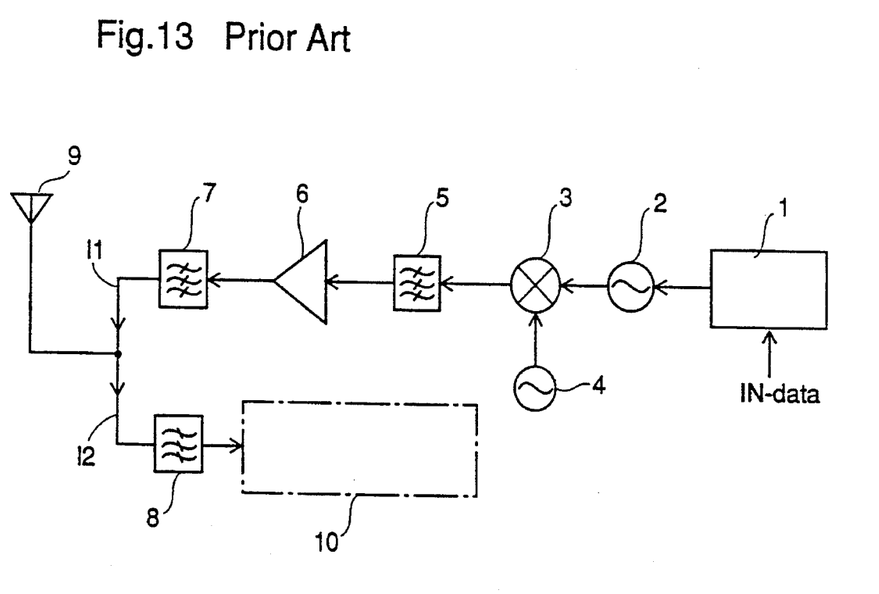
FIG. 13 is a block diagram illustrating a transmitter of a portable telephone of a general frequency modulation system according to the prior art.

FIG. 13 is a block diagram illustrating a structure of a transmitter of an ordinary analog modulation (frequency modulation) type portable telephone. In the figure, a control circuit 1 controls a voltage-controlled crystal oscillator 2 (hereinafter referred to as a VCXO) in response to speech signal data (hereinafter referred to as IN-data). The VCXO 2 performs frequency modulation in response to the IN-data and outputs a frequency modulated signal (hereinafter referred to as FM signal) in the intermediate frequency band (hereinafter referred to as IF band) to a mixer 3. A frequency synthesizer 4 produces a carrier wave signal in the radio frequency band (hereinafter referred to as RF band) and outputs the signal to the mixer 3. The mixer 3 mixes the FM signal in the IF band with the carrier wave signal in the RF band to convert the FM signal in the IF band into an FM signal in the RF band. A band-pass filter (hereinafter referred to as BPF) 5 eliminates unnecessary waves caused by the frequency conversion from the FM signal in the RF band. A power amplifier 6 amplifies the power level of the FM signal in the RF band to a power level of an antenna output. A BPF 7 eliminates unnecessary waves caused by the amplification from the FM signal and transmits a signal in a frequency band suitable for transmission. The signal transmitted through the BPF 7 is radiated into space from an antenna 9. On the other hand, signals received by the antenna 9 are applied to a BPF 8. The BPF 8 transmits only a signal in a frequency band to be received by a receiving circuit 10. The BPF 8 and the receiving circuit 10 are constituents of a receiver.

Figure 14:
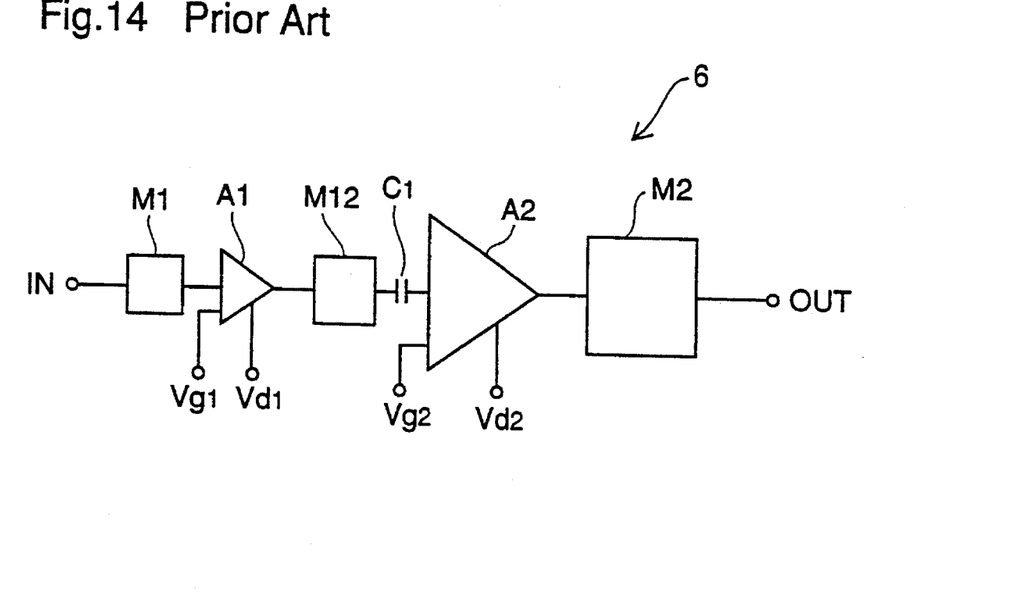
FIG. 14 is a block diagram illustrating a power amplifier included in the transmitter shown in FIG. 13.

FIG. 14 is a block diagram illustrating the power amplifier 6 in more detail. An input terminal IN of the power amplifier 6 is connected through an input matching circuit M1 to an input end of a driver stage A1 for driving an output amplifier stage A2. An output end of the driver stage A1 is connected through an inter-stage matching circuit M12 and an AC coupling capacitor C1 to an input end of the output amplifier stage A2. An output end of the output amplifier stage A2 is connected through an output matching circuit M2 to an output terminal OUT. The driver stage A1 comprises an FET having a gate bias terminal Vg1 and a drain bias terminal Vd1, and the output amplifier stage A2 comprises an FET having a gate bias terminal Vg2 and a drain bias terminal Vd2.

Generally, in transmitters of portable telephones, an output power exceeding 1 W is required for the analog modulation (frequency modulation). In order to improve the efficiency in the high-power output operation exceeding 1 W, various means, such as harmonic processing techniques, have been adopted in the design of the power amplifier. However, the transmitter of the portable telephone operates at a high power level near the maximum power level when it is used in a place far from the base station. On the other hand, when the transmitter is used in a place near the base station, it is preferable that the transmitter should be used at a low power level, for example, 10–20 dB reduced per 1 W, to increase the lifetime of the battery. That is, it is desired to reduce the current consumption of the power amplifier of the transmitter. In order to realize the low-power output operation of the transmitter, in the prior art power amplifier 6 shown in FIG. 14, bias voltages applied to the gate bias terminals Vg1 and Vg2 and the drain bias terminals Vd1 and Vd2 of the driver stage A1 and the output amplifier stage A2 are controlled to reduce the current consumption of the output amplifier stage A2 which consumes most of the power in the low-power output operation. Although the input power applied to the input terminal IN of the power amplifier 6 is usually constant, the input power may be controlled to realize the low-power output operation of the power amplifier 6.

Figure 15:
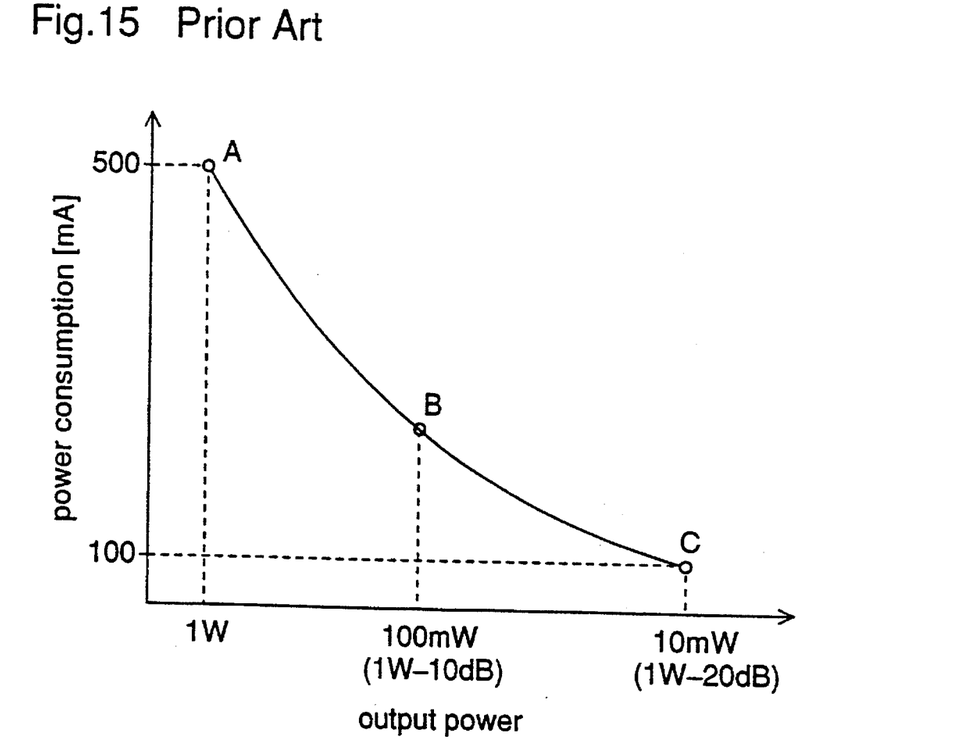
FIG. 15 is a graph illustrating output power vs. current consumption characteristics when a gate bias voltage and a drain bias voltage applied to a driving stage A1 and an output amplifier stage A2 are controlled in the power amplifier shown in FIG. 14.

FIG. 15 is a graph illustrating a relationship between the output power and the current consumption when the gate bias voltages applied to the gate bias terminals Vg1 and Vg2 and the drain bias voltages applied to the drain bias terminals Vd1 and Vd2 are controlled in the prior art power amplifier 6. In the graph, a point A denotes the current consumption when the output power is 1 W, a point B denotes the current consumption when the output power is 100 mW (1 W–10 dB), and a point C denotes the current consumption when the output power is 10mW (1 W–20 dB).

Figure 16:
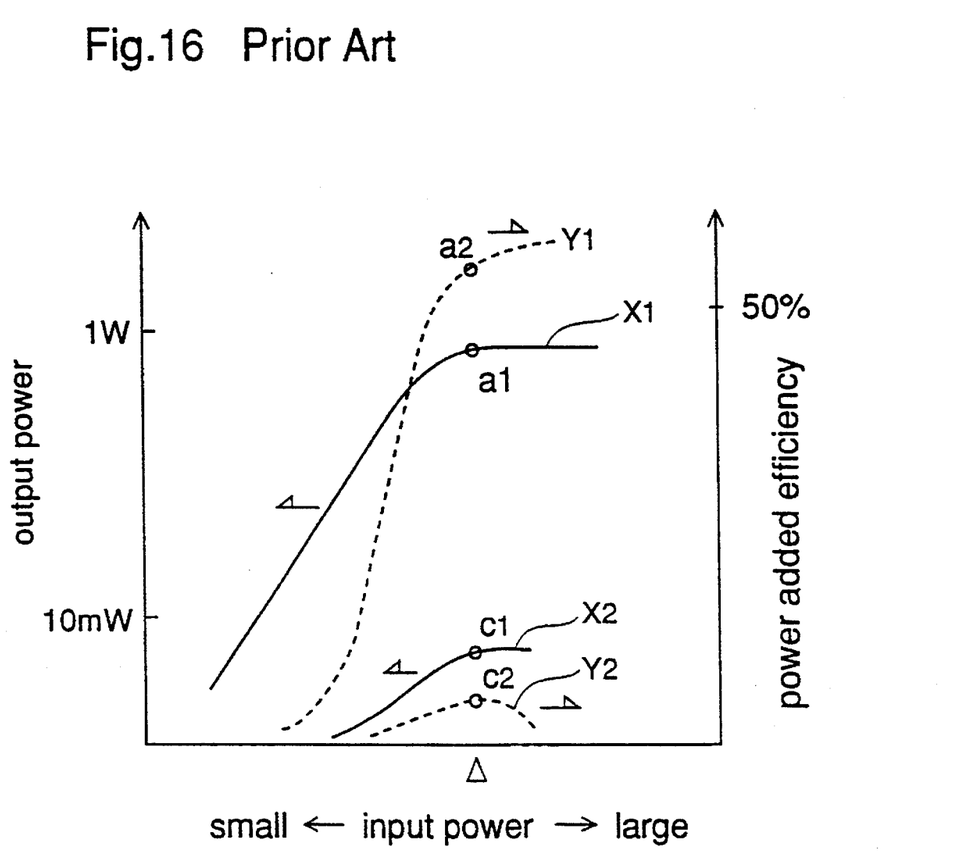
FIG. 16 is a graph illustrating input power vs. output power characteristics and input power vs. power added efficiency characteristics of the power amplifier shown in FIG. 14.

FIG. 16 is a graph illustrating the input power vs. output power characteristics and the input power vs. power added efficiency characteristics of the power amplifier 6. In the graph, continuous lines X1 and X2 show the input power vs. output power characteristics in the high-power output operation and the low-power output operation of the power amplifier 6, respectively, and dotted lines Y1 and Y2 show the input power vs. power added efficiency characteristics in the high-power output operation and the low-power output operation of the power amplifier 6, respectively. Further, points a1 and a2 show the output power and the power added efficiency at the point A of FIG. 15, respectively, and points c1 and c2 show the output power and the power added efficiency at the point C of FIG. 15, respectively. The input power to a1, a2, c1, and c2 is fixed at a prescribed value Δ.

As shown in FIG. 16, in the prior art power amplifier, a high-efficiency operation with the power added efficiency of 50–60% is realized by a higher harmonic processing circuit or the like included in the matching circuit M2 during the high-power output operation (point A in FIG. 15). However, in the low-power output operation (point C in FIG. 15), the efficiency is significantly reduced to several percent. The reason for the reduction in the efficiency is described hereinafter. Even when the drain bias voltage is reduced to reduce the current consumption by the power amplifier 6, since the voltage supplied from the battery is fundamentally constant, the power consumption with respect to DC and viewed from the battery side depends on the reduction in the current only. In addition, since the gate width of the FET of the output amplifier stage A2 is increased to improve the efficiency in the high-power output operation, the control of the drain bias voltage alone is not enough for a significant reduction in the current consumption. For example, when the drain voltage is reduced while maintaining the operation of the FET, the current consumption exceeds 100 mA.

As described above, although the prior art power amplifier 6 operates efficiently during the high-power, almost the maximum power, output operation, the efficiency is significantly reduced during the low-power output operation.

Figure 17:
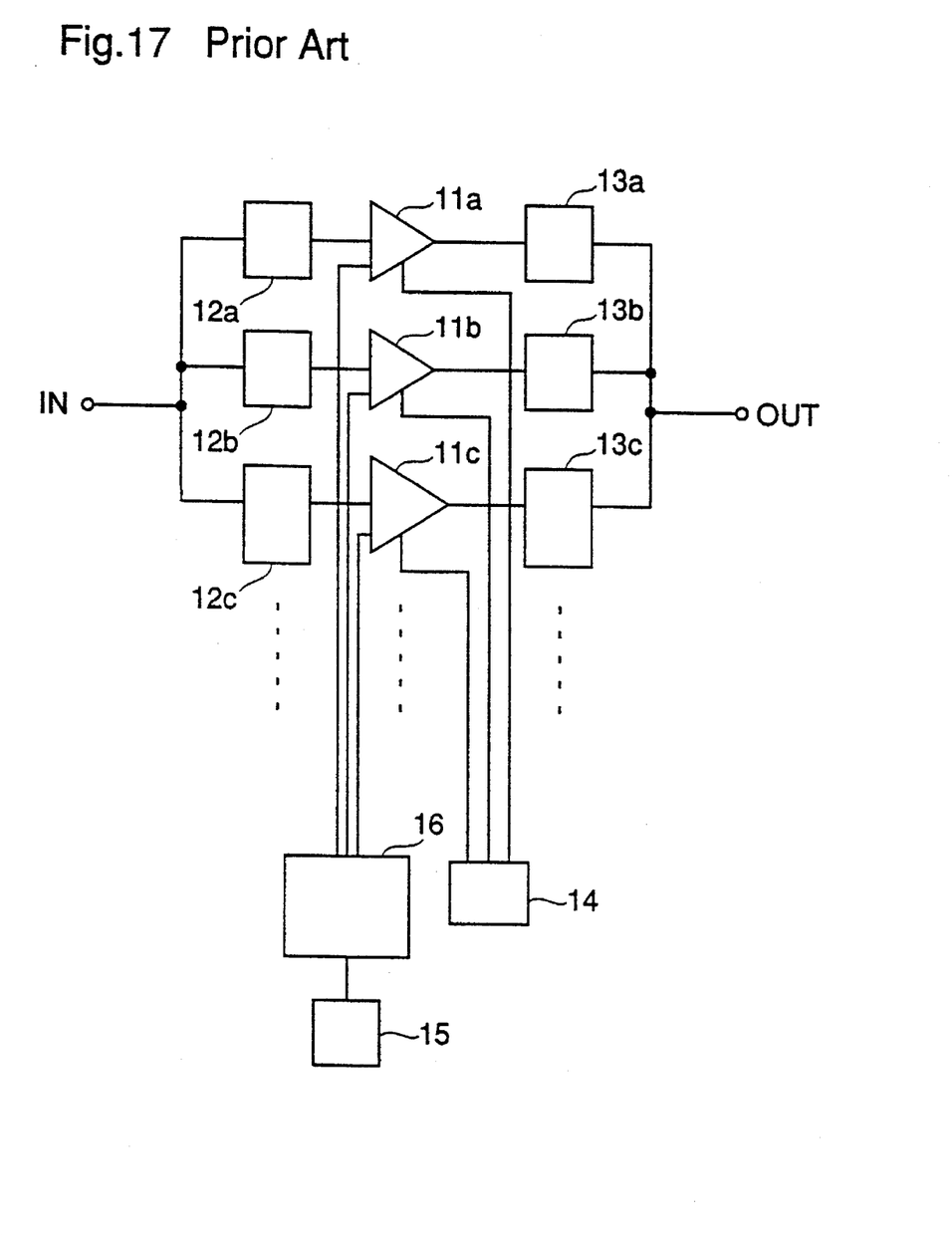
FIG. 17 is a block diagram illustrating a power amplifier according to the prior art.

In order to solve the above-described problem, Japanese Published Patent Application No. Hei. 3-104408 discloses a power amplifier in which a plurality of amplifier circuits providing different amplified outputs are connected in parallel between an input terminal and an output terminal and voltages applied to the amplifier circuits are controlled. FIG. 17 is a block diagram illustrating the power amplifier. The power amplifier comprises three amplifier circuits connected in parallel with each other between an input terminal IN and an output terminal OUT. A first amplifier circuit comprises an amplifier FET 11a, an input side matching circuit 12a, and an output side matching circuit 13a. A second amplifier circuit comprises an amplifier FET 11b, an input side matching circuit 12b, and an output side matching circuit 13b. A third amplifier circuit comprises an amplifier FET 11c, an input side matching circuit 12c, and an output side matching circuit 13c. A control circuit 16 is connected between a power supply 15 and gate electrodes of the respective FETs 11a to 11c and controls voltages applied to the gate electrodes of the FETs. A power supply 14 is connected to drain electrodes of the respective FETs 11a to 11c.

In this prior art power amplifier, the amplifier FETs 11a to 11c are selectively driven by the control circuit 16, whereby the power level of the amplified output applied to the output terminal OUT is changed. In addition, these amplifier FETs are designed so as to operate efficiently. Therefore, a plurality of amplified outputs with different power levels are obtained.

In this prior art power amplifier, however, the matching circuits 13a and 13b on the output side of the amplifier FETs 11a to 11c are directly connected to the output terminal OUT as shown in FIG. 17. In this case, when the amplifier FET 11a is driven while the amplifier FETs 11b and 11c are not driven, not only the matching circuit 13a for the amplifier FET 11a that outputs amplified signals but also the matching circuits 13b and 13c for the amplifier FETs 11b and 11c that do not output amplified signals are electrically connected to the output terminal OUT. Therefore, in order to selectively operate those three amplifier FETs efficiently, the impedance of the output side matching circuit for the operated, i.e., selected, amplifier FET has to be controlled so as to have an optimum load curve along which the amplifier FET operates efficiently, while considering the impedances of the unselected amplifier FETs and the output side matching circuits therefor. However, it is very difficult to set the impedance of the output side matching circuit for the selected amplifier FET while considering the impedances of the output side matching circuits for the unselected amplifier FETs because the impedance of one matching circuit varies with a variation in the impedance of the other matching circuit. Actually, it is difficult to selectively operate the amplifier FETs providing different amplified outputs with high efficiency. Furthermore, since the amplifier circuit in which the amplifier FET is operated is electrically connected to the amplifier circuit in which the amplifier FET is not operated, a feedback loop is produced between these amplifier circuits, resulting in an incidental oscillation.

SUMMARY OF THE INVENTION

It is an object of the present invention to provide a power amplifier including a plurality of amplifier circuits outputting amplified signals of different power levels, in which each amplifier circuit is selectively operated with high efficiency.

It is another object of the present invention to provide a power amplifier including a plurality of amplifier circuits outputting amplified signals of different power levels, in which each amplifier circuit is selectively operated with high efficiency and no feedback loop is produced between an operated amplifier circuit and an unoperated amplifier circuit.

It is still another object of the present invention to provide a power amplifier including a single amplifier circuit, in which the amplifier circuit always operates with high efficiency and the power level of the amplified output from the amplifier circuit is varied by controlling the power supply voltage.

Other objects and advantages of the invention will become apparent from the detailed description that follows. The detailed description and specific embodiments described are provided only for illustration since various additions and modifications within the scope of the invention will be apparent to those of skill in the art from the detailed description.

According to a first aspect of the present invention, a power amplifier comprises an input terminal to which an input signal to be amplified is applied; an output terminal from which an amplified signal is output; a first amplifier circuit connected between the input terminal and the output terminal and comprising a first amplifier FET and a first matching circuit, wherein the input terminal is connected to an input end of the first amplifier FET, an output end of the first amplifier FET is connected to an input end of the first matching circuit, and an output end of the first matching circuit is connected to the output terminal; and a second amplifier circuit connected between the input terminal and the output terminal and comprising a second amplifier FET, a second matching circuit, and a first switching circuit, wherein the input terminal is connected to an input end of the second amplifier FET, an output end of the second amplifier FET is connected to an input end of the second matching circuit, an output end of the second matching circuit is connected to an input end of the first switching circuit, and an output end of the first switching circuit is connected to the output terminal. In this power amplifier, the first amplifier circuit outputs an output signal of a first power level with high efficiency when the first amplifier FET is operated while the second amplifier FET is not operated and the first switching circuit is turned off, and the second amplifier circuit outputs an output signal of a second power level with high efficiency when the first amplifier FET is not operated while the second amplifier FET is operated and the first switching circuit is turned on. The impedance of the second matching circuit for the second amplifier circuit is adjusted to an optimum value that secures a high efficiency of the second amplifier circuit in consideration of the impedance of the first amplifier circuit while the impedance of the first matching circuit for the first amplifier circuit is adjusted to an optimum value that secures a high efficiency of the first amplifier circuit regardless of the impedance of the second amplifier circuit. Thereby, both the first and second amplifier circuits operate efficiently and output the amplified signal of the first power level and the amplified signal of the second power level, respectively. Accordingly, the impedances of the output side matching circuits of the first and second amplifier circuits which output amplified signals of different power levels can be optimized with high precision. As the result, in both the high-power output operation and the low-power output operation, the efficiencies of the first and second amplifier circuits are significantly improved.

According to a second aspect of the present invention, in the above-described power amplifier, the first power level is larger than the second power level, and the power amplifier further comprises a third matching circuit having an input end connected to the input terminal and an output end connected to the input end of the first amplifier FET; and a second switching circuit and a fourth matching circuit, wherein an input end of the second switching circuit is connected to the input terminal, an output end of the second switching circuit is connected to the input end of the fourth matching circuit, and an output end of the fourth matching circuit is connected to the input end of the second amplifier FET. In this power amplifier, when the first and second switching circuits are turned off to operate the first amplifier FET, the first amplifier circuit outputs an amplified signal of a high power level. On the other hand, when the first and second switching circuits are turned on to operate the second amplifier FET, the second amplifier FET outputs an amplified signal of a low power level. Accordingly, when the first amplifier FET (first amplifier circuit) is in the unoperated state and the second amplifier FET (second amplifier circuit) is in the operated state to produce the amplified output of the low power level, even if the input impedance of the first amplifier circuit significantly varies and an impedance mismatch occurs between the input terminal and the second amplifier circuit, the third matching circuit compensates this mismatch. As the result, the low power level amplified output of the low power level is obtained by the stable and efficient operation.

According to a third aspect of the present invention, in the above-described power amplifier, the first power level is larger than the second power level, and the power amplifier further comprises a third switching circuit for branching a gate bias applied to the first amplifier FET in a gate bias circuit of the first amplifier FET. When the input impedance of the first amplifier FET is considerably lower than that of the second amplifier FET, the input impedance of the first amplifier FET is increased by branching the gate bias applied to the first amplifier FET, whereby the signal input to the input terminal is supplied to the second amplifier FET with high reliability. As the result, the operation of the second amplifier circuit is made stable.

According to a fourth aspect of the present invention, in the above-described power amplifier, the first power level is larger than the second power level, and the power amplifier further comprises a fourth switching circuit connected between the input terminal and the input end of the first amplifier FET, which fourth switching circuit is turned on when the first amplifier FET is operated and turned off when the second amplifier FET is operated. Since the first switching circuit is turned off during the operation of the first amplifier FET, no feedback loop is produced between the first amplifier circuit and the second amplifier circuit. Further, since the third switching circuit is turned off during the operation of the second amplifier FET, no feedback loop is produced between the first amplifier circuit and the second amplifier circuit.

According to a fifth aspect of the present invention, a power amplifier comprises an input terminal to which an input signal to be amplified is applied; an output terminal from which an amplified signal is output; an amplifier FET receiving the input signal from the input terminal, amplifying the input signal, and outputting an amplified signal having a power level; a plurality of matching circuits with different impedances, each matching circuit having an input end and an output end; a first switching circuit selecting one of the matching circuits in response to the power level of the amplified signal and connecting the amplifier FET to the input end of the selected matching circuit, which selected matching circuit provides the optimum impedance for high-efficiency operation of the amplifier FET; and a second switching circuit selectively connecting the output end of the selected matching circuit to the output terminal. Therefore, the amplified output from the amplifier FET is transmitted to the output terminal through the selected matching circuit that provides an optimum impedance match in response to the power level of the amplified output. As a result, a plurality of amplified outputs having different power levels are obtained with high efficiency.

DETAILED DESCRIPTION OF THE PREFERRED EMBODIMENTS

Figure 1:
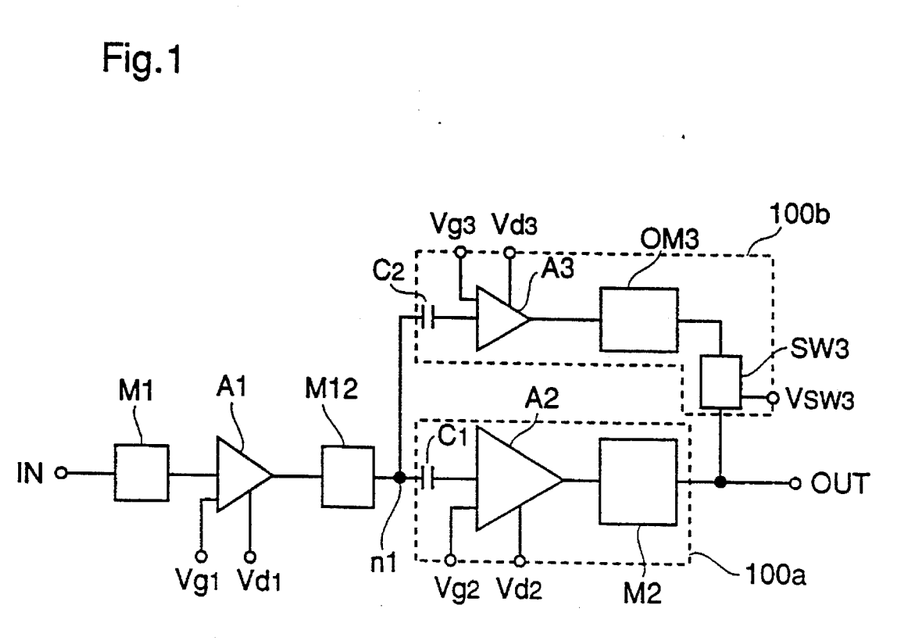
FIG. 1 is a block diagram illustrating a power amplifier in accordance with a first embodiment of the present invention.

FIG. 1 is a block diagram illustrating a power amplifier in accordance with a first embodiment of the present invention. In the figure, the same reference numerals as in FIG. 14 designate the same or corresponding parts. In the power amplifier shown in FIG. 1, a second amplifier circuit 100b comprising an AC coupling capacitor C2, an output amplifier stage A3, an output matching circuit OM3, and an FET switch SW3 is connected in parallel with a first amplifier 100a comprising an AC coupling capacitor C1, an output amplifier stage A2, and an output matching circuit M2. The structure of the first amplifier 100a is identical to that of the prior art power amplifier shown in FIG. 14. More specifically, the output amplifier stage A3 comprises an amplifier FET having a gate width narrower than the gate width of the amplifier FET of the output amplifier stage A2, and an input end of the output amplifier stage A3 is connected through the AC coupling capacitor C2 to a junction n1 of the inter-stage matching circuit M12 and the AC coupling capacitor C1 while an output end thereof is connected to an input end of the output matching circuit OM3. An output end of the output matching circuit OM3 is connected through the FET switch SW3 to the output terminal OUT. The impedance of the output matching circuit OM3 is appropriately set so that it has a load curve that secures a high-efficiency operation of the output amplifier stage A3 while considering the impedances of the output amplifier stage A2 and the output matching circuit M2.

Figure 2:
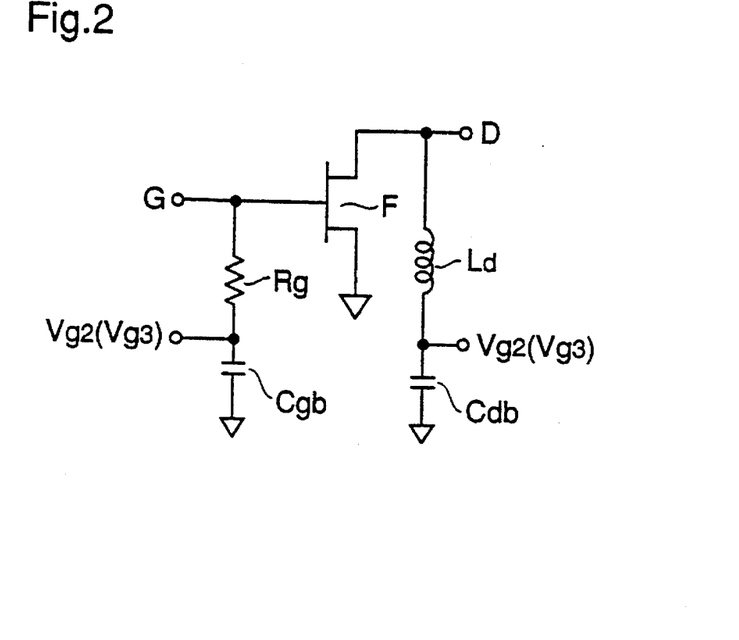
FIG. 2 is an equivalent circuit diagram illustrating an output amplifier stage A2 (A3) included in the power amplifier shown in FIG. 1.

FIG. 2 is an equivalent circuit diagram of the output amplifier stage A2 (A3). In FIG. 2, reference character F denotes an amplifier FET, Rg a gate stabilizing resistor, Cgb a gate bias capacitor, Ld a drain bias inductor, Cdb a drain bias capacitor, G a gate terminal, Vg2 a gate bias terminal, D a drain terminal, and Vd2 a drain bias terminal. A gate of the amplifier FET F is connected to the gate terminal G, and a junction of the gate and the gate terminal G is connected to an end of the gate stabilizing resistor Rg. The other end of the gate stabilizing resistor Rg is connected to the gate bias terminal Vg2. A junction of the gate stabilizing resistor Rg and the gate bias terminal Vg2 is connected through the gate bias capacitor Cgb to ground. A drain of the amplifier FET F is connected to the drain terminal D, and a junction of the drain and the drain terminal D is connected to an end of the drain bias inductor Ld. The other end of the drain bias inductor Ld is connected to the drain bias terminal Vd2, and a junction of the drain bias inductor Ld and the drain bias terminal Vd2 is connected through the gate bias capacitor Cgb to ground.

Figure 3:
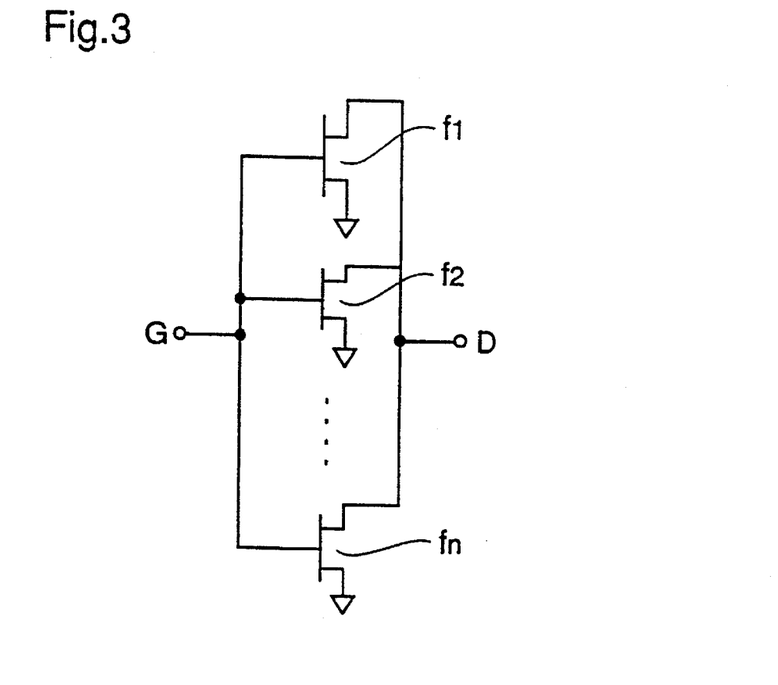
FIG. 3 is an equivalent circuit diagram illustrating a concrete structure of an amplifier FET shown in FIG. 2.

FIG. 3 shows a specific structure of the amplifier FET included in the output amplifier stage shown in FIG. 2. In the figure, reference characters f1 to fn designate fundamental FET cells. Gates of the FETs f1 to fn are connected to a common gate terminal G and drains of the FETs are connected to a common drain terminal D. Usually, the gate width of the amplifier FET constituting the output amplifier stage A2 (A3) is significantly larger than the gate width of the FET constituting the driver stage A1. However, when the circuit design and the fabrication process are considered, the structure of the amplifier FET shown in FIG. 3 in which the gates and the drains of the FETs f1 to fn having the same gate width are connected to the common gate terminal and the common drain terminal, respectively, to obtain a desired total gate equal to the sumr of the gate widths of the FETs f1 to fn is preferable to a single amplifier FET having a large gate width.

Figure 4:
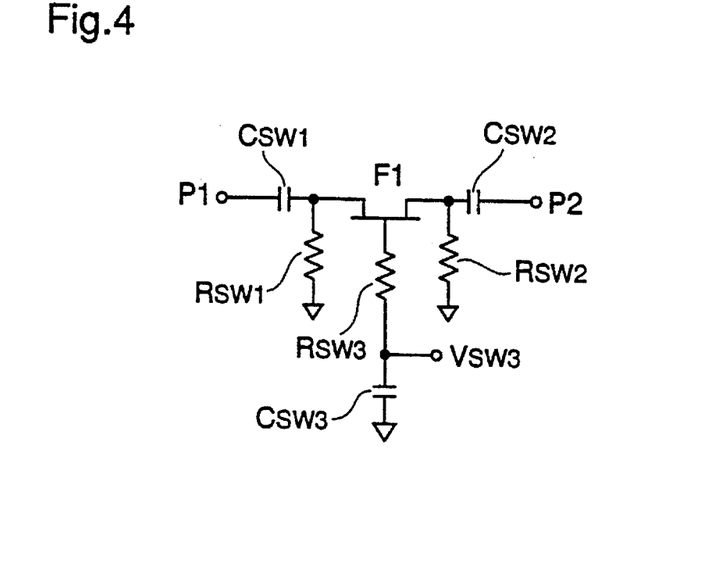
FIG. 4 is an equivalent circuit diagram illustrating an FET switch SW3 included in the power amplifier shown in FIG. 1.

FIG. 4 is an equivalent circuit diagram illustrating the FET switch SW3. In the figure, reference character F1 denotes an FET, P1 an input terminal, P2 an output terminal, Csw1, Csw2, and Csw3 AC coupling capacitors, Rsw1, Rsw2, and Rsw3 resistors for applying a DC bias to the FET F1. The impedance of these resistors is sufficiently higher than the characteristic impedance of the transmission line. In addition, reference character Vsw3 designates a control terminal for controlling ON/OFF switching of the FET F1. A source (drain) of the FET F1 is connected through the AC coupling capacitor Csw1 to the input terminal P1, and a junction of the FET F1 and the AC coupling capacitor Csw1 is connected through the resistor Rsw1 to ground. A drain (source) of the FET F1 is connected through the AC coupling capacitor Csw2 to the output terminal P2, and a junction of the FET F1 and the AC coupling capacitor Csw2 is connected through the resistor Rsw2 to ground. Further, a gate of the FET F1 is connected through the resistor Rsw3 to the control terminal Vsw3, and a junction of the FET F1 and the control terminal Vsw3 is connected through the AC coupling capacitor Csw3 to ground.

A description is given of the operation.

During the high-power output operation, the gate bias voltage applied to the gate bias terminal Vg3 of the output amplifier stage A3 is controlled not to exceed the pinch-off voltage of the amplifier FET of the output amplifier stage A3, so that the output amplifier stage A3 is not driven. In addition, the FET switch SW3 is turned off by controlling the gate bias voltage applied to the control terminal Vsw3, so that the output side of the output amplifier stage A3, i.e., the second amplifier circuit 100b, is electrically separated from the first amplifier circuit 100a. In this state, the driver stage A1 and the output amplifier stage A2 are driven. Therefore, in the high-power output operation, the second amplifier circuit 100b does not adversely affect the operation of the first amplifier circuit 100a, whereby the first amplifier circuit 100a operates efficiently and outputs an amplified output of a high power level to the output terminal OUT. On the other hand, during the low-power output operation, the FET switch SW3 is turned on by controlling the gate bias voltage applied to the control terminal Vsw3 to electrically connect the output end of the output amplifier stage A3 with the OUT terminal. In other words, the output end of the second amplifier circuit 100b is electrically connected to the OUT terminal. In addition, the gate bias voltage applied to the gate bias terminal Vg2 of the amplifier FET constituting the output amplifier stage A2 is controlled not to exceed the pinch-off voltage of the amplifier FET so that the output amplifier stage A2 is not driven. In this state, the driver stage A1 and the output amplifier stage A3 are operated. At this time, the impedance of the output matching circuit OM3 of the output amplifier stage A3 is appropriately set so that it has a load curve that secures a high-efficiency operation of the output amplifier stage A3 considering the impedances of the output amplifier stage A2 and the output matching circuit M2. Therefore, the second amplifier circuit 100b, i.e., the output amplifier stage A3, operates efficiently and outputs a high power level amplified output to the output terminal OUT.

Figure 5:
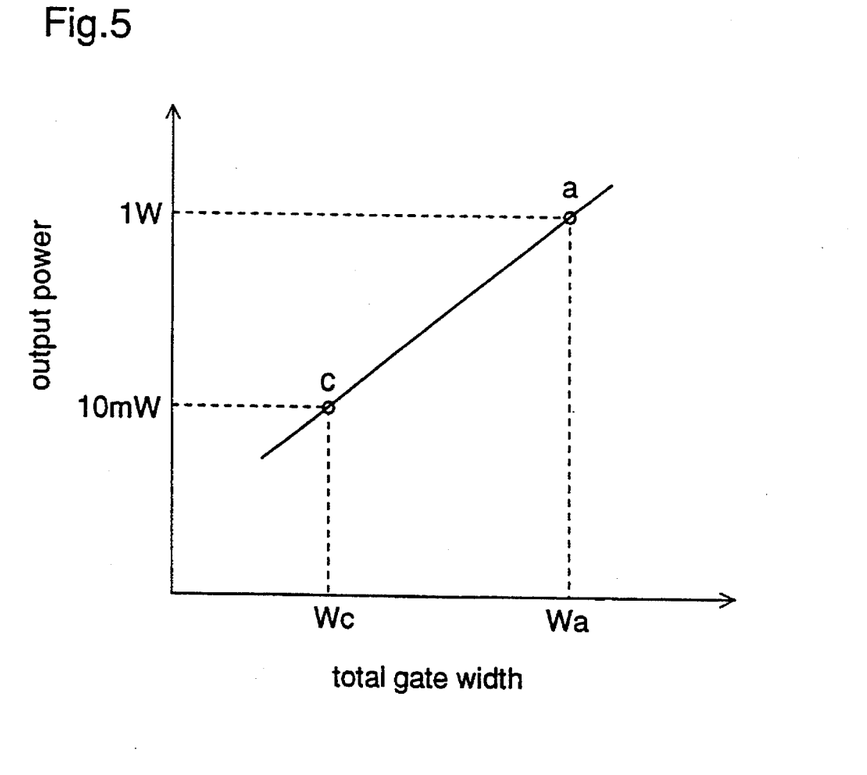
FIG. 5 is a graph illustrating output power vs. gate width characteristics of the amplifier FET in the output amplifier stage A2 (A3) shown in FIG. 2.
Figure 6:
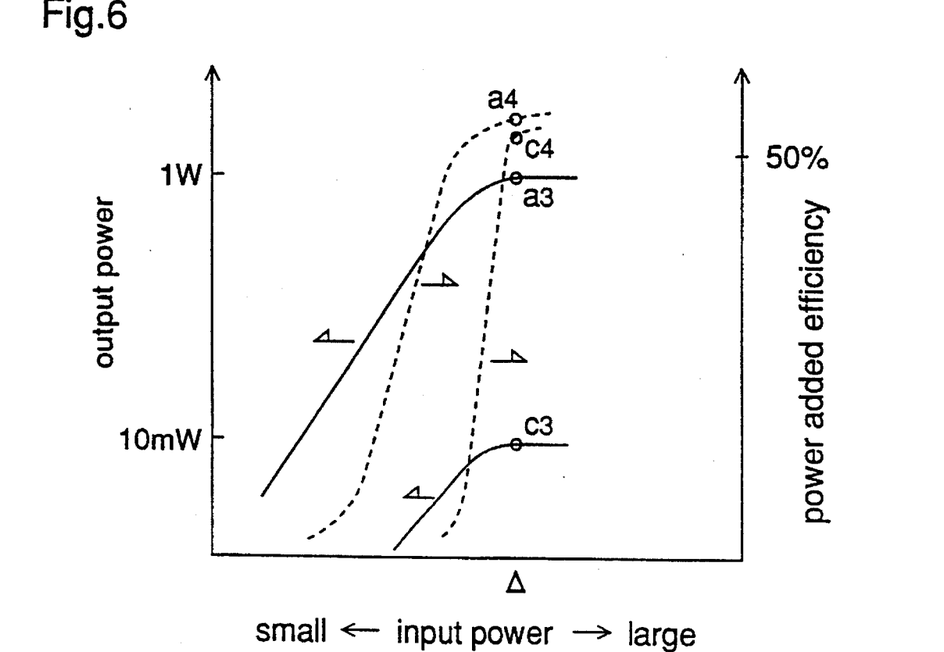
FIG. 6 is a graph illustrating input power vs. output power characteristics and input power vs. power added efficiency characteristics in the high-power output operation of the output amplifier stage A2 and the low-power output operation of the output amplifier stage A3.

Each of the amplifier FETs constituting the output amplifier stages A2 and A3 has a gate width that provides a desired high-power output under the bias condition in which the output amplifier stages A2 and A3 operate efficiently. When the gate width of the amplifier FET and the output power have the relationship shown in FIG. 5, in order to make the output amplifier stages A2 and A3 output amplified powers of 1 W and 10 mW, respectively, the gate widths of the FETs constituting the output amplifier stages A2 and A3 have to be set to Wa and Wc, respectively. FIG. 6 is a graph illustrating input power vs. output power characteristic curves and input power vs. power added efficiency characteristic curves in the power amplifier in which the gate widths of the amplifier FETs are set as described above. In the graph, the output power and the power added efficiency at the point a in FIG. 5 are plotted by a3 and a4, respectively, and the output power and the power added efficiency at the point c in FIG. 5 are plotted by c3 and c4, respectively. The input power is fixed at a prescribed value shown by Δ. It can be seen from FIG. 6 that the efficiency in the low-power output operation of the power amplifier according to the invention is as high as the efficiency in the high-power output operation. In addition, when the amplifier FET constituting the output amplifier stage A3 is designed so that it operates efficiently under the bias condition for the ordinary operation, i.e., the bias condition that secures high-power output and high efficiency of the output amplifier stage A2, an efficient operation with reduced current consumption is achieved with no reduction in the drain bias voltage during the low-power output operation.

As described above, in the power amplifier according to the present invention, the output end of the second amplifier circuit 100b for the low-power output operation is connected through the FET switch SW3 to the output end of the first amplifier circuit 100a for the high-power output operation. The impedance of the output matching circuit OM3 of the second amplifier circuit 100b is adjusted to an optimum value that secures high efficiency of the second amplifier circuit 100b in consideration of the impedance of the first amplifier circuit 100a comprising the output amplifier stage A2 and the output matching circuit M2. On the other hand, the impedance of the output matching circuit M2 of the first amplifier circuit 100a is adjusted to an optimum value that secures high efficiency of the first amplifier circuit 100a regardless of the impedance of the second amplifier circuit 100b comprising the output amplifier stage A3 and the output matching circuit OM3. Thereby, both the first and second amplifier circuits 100a and 100b operate efficiently and output a prescribed high-power level amplified output and a prescribed low-power level amplified output. Therefore, in the power amplifier according to the present invention, the output matching circuits M2 and OM3 of the first and second amplifier circuits 100a and 100b have precisely optimized impedances, respectively, and the efficiencies of the amplifier circuits 100a and 100b are significantly improved in both the high-power output operation and the low-power output operation.

In order to transmit the amplified output to the output terminal OUT efficiently while the high-power output operation, both the output matching circuits M2 and OM3 may be connected to the output terminal OUT through a power synthesizer, such as a Wilkinson type power synthesizer, in place of the FET switch SW3. In this case, however, since such power synthesizer generally uses a ¼ wavelength transmission line, the size of the power synthesizer unfavorably increases when it is used in a low frequency band ranging from 800 MHz to 2 GHz that is generally used for portable telephones, resulting in an increase in the size of the power amplifier. Therefore, the FET switch SW3 inserted between the output amplifier stage A3 and the output matching circuit OM3 is advantageous with respect to a reduction in the size of the power amplifier.

Embodiment 2.

Figure 7:
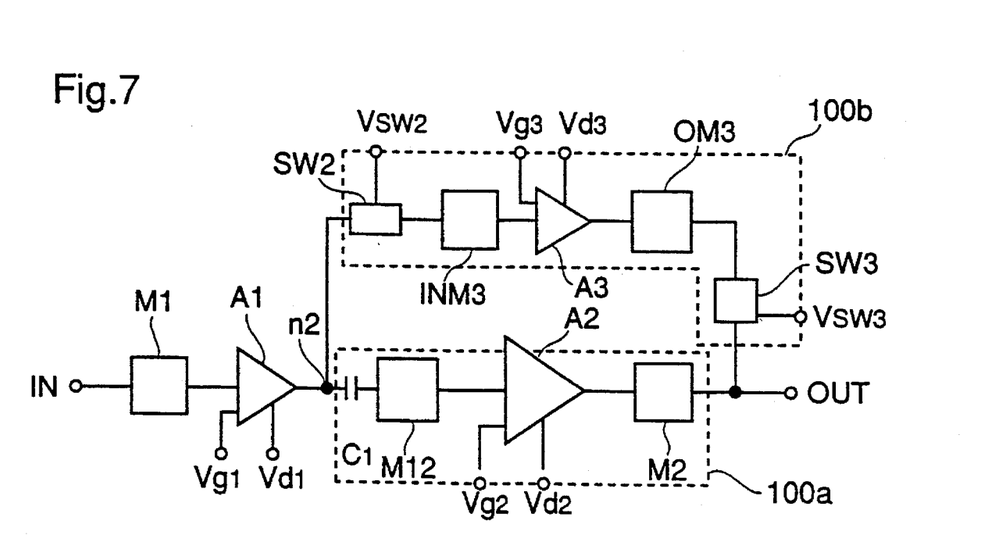
FIG. 7 is a block diagram illustrating a power amplifier in accordance with a second embodiment of the present invention.

FIG. 7 is a block diagram illustrating a power amplifier in accordance with a second embodiment of the present invention. In FIG. 7, the same reference numerals as in FIG. 1 designate the same or corresponding parts. Reference character SW2 denotes an FET switch, Vsw2 a control terminal for ON/OFF switching of the FET switch SW2, INM3 an input matching circuit, and n2 a junction of a driver stage A1 and an AC coupling capacitor C1, to which a signal to be amplified in the first amplifier circuit 100a or the second amplifier circuit 100b is applied.

While in the above-described first embodiment, the inter-stage matching circuit M12 corrects the mismatch between the driver stage A1 and the output amplifier stage A3 and the mismatch between the driver stage A1 and the output amplifier stage A2, i.e., the inter-stage matching circuit M12 functions as an input matching circuit between the first amplifier circuit 100a and the second amplifier circuit 100b. However, when the FET constituting the output amplifier stage A2 is pinched off in the low-power output operation, the input impedance of the FET significantly varies and the inter-stage matching circuit M12 alone cannot correct the impedance mismatch between the driver stage A1 and the output amplifier stage A3. In the power amplifier according to this second embodiment of the invention, in order to solve the above-described problem in the first embodiment, the first and second amplifier circuits 100a and 100b include different input matching circuits. More specifically, the FET switch SW2 is connected to the junction n2 between the driver stage A1 and the AC coupling capacitor C1, the input end of the output amplifier stage A3 of the second amplifier circuit 100b is connected through the input matching circuit INM3 to the FET switch SW2, and the inter-stage matching circuit M12 is used as an input matching circuit for the first amplifier circuit 100a. The input matching circuit INM3 is set so that the driver stage A1 impedance-matches to the output amplifier stage A3 during the low-power output operation in which the second amplifier circuit 100b operates efficiently.

In the power amplifier according to the second embodiment of the invention, the FET switches SW2 and SW3 are turned off during the high-power output operation so that the output amplifier stage A2 of the first amplifier circuit 100a is driven, whereby a desired high-power output is obtained by the high-efficiency operation of the first amplifier circuit 100a. In the low-power output operation, the FET switches SW2 and SW3 are turned on to turn off the output amplifier stage A2 of the second amplifier circuit 100a and to turn on the output amplifier stage A3 of the second amplifier circuit 100b, whereby a desired low-power output is applied to the output terminal OUT. Accordingly, desired outputs are obtained by the highly-efficient operation of the amplifier circuits 100a and 100b in both the high-power output operation and the low-power output operation, as in the above-described first embodiment. Further, when the output amplifier stage A2 is in the off state while the low-power output operation, i.e., when the amplifier FET constituting the output amplifier stage A2 is in the pinch-off state, the input impedance of the FET significantly varies and an impedance mismatch occurs between the driver stage A1 and the output amplifier stage A3. In this second embodiment, the input matching circuit INM3 compensates this impedance mismatch. Therefore, the low-power output operation is performed with high efficiency and high reliability.

Embodiment 3.

Figure 8:
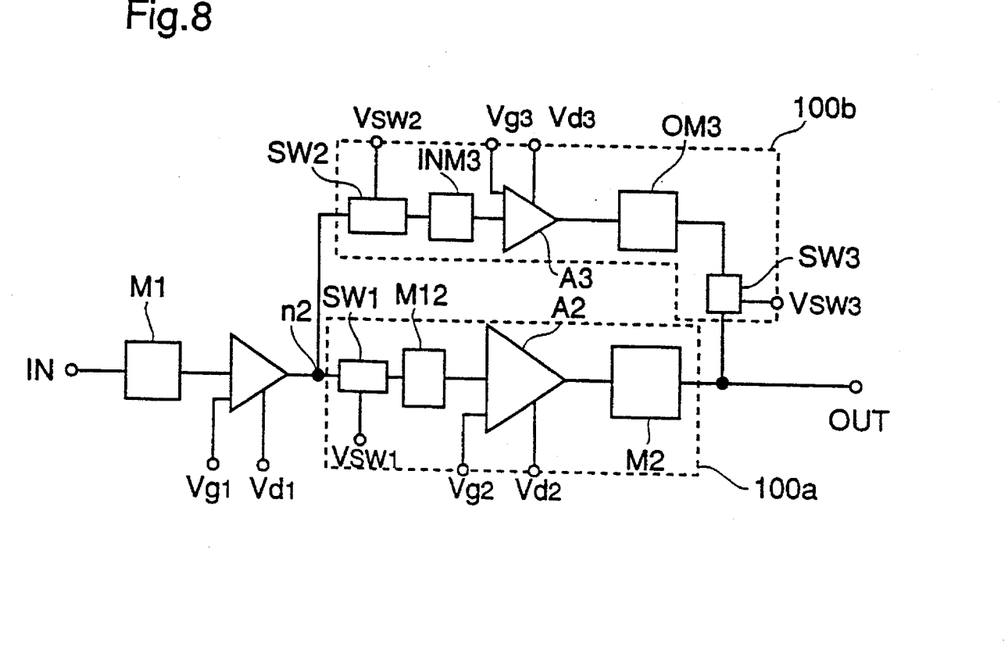
FIG. 8 is a block diagram illustrating a power amplifier in accordance with a third embodiment of the present invention.

FIG. 8 is a block diagram illustrating a power amplifier in accordance with a third embodiment of the present invention. In FIG. 8, the same reference numerals as in FIG. 7 designate the same or corresponding parts. Reference character SW1 denotes an FET switch, Vsw1 a control terminal for ON/OFF switching of the switch SW1, and M12 an input matching circuit. The circuit structure of the FET switch SW1 is identical to the FET switch SW3 of the first embodiment.

In the above-described first and second embodiments of the invention, no feedback loop is produced between the first and second amplifier circuits 100a and 100b because the FET switch SW3 is turned off when the first amplifier circuit 100a is operated. However, since the FET switches SW2 and SW3 are turned on when the second amplifier circuit 100b is operated, a feedback loop is produced between these circuits 100a and 100b, resulting in parasitic oscillation. The power amplifier according to this third embodiment is made to solve this problem. More specifically, the AC coupling capacitor C1 of the first amplifier circuit 100a in the power amplifier shown in FIG. 7 is replaced with the FET switch SW1, and the FET switch SW1 is turned off during the low-power output operation of the second amplifier circuit 100b so that no feedback loop is produced between the first and second amplifier circuits 100a and 100b.

In the power amplifier according to this third embodiment of the invention, the same effects as described in the second embodiment are achieved. In addition, when the FET switch SW1 is turned off during the low-power output operation of the second amplifier circuit 100b, the second amplifier circuit 100b is electrically separated from the first amplifier circuit 100a. Therefore, no feedback loop is produced between the first and second amplifier circuits neither in the operation of the first amplifier circuit 100a nor in the operation of the second amplifier circuit 100b, whereby the parasitic oscillation is avoided.

Embodiment 4.

Figure 9:
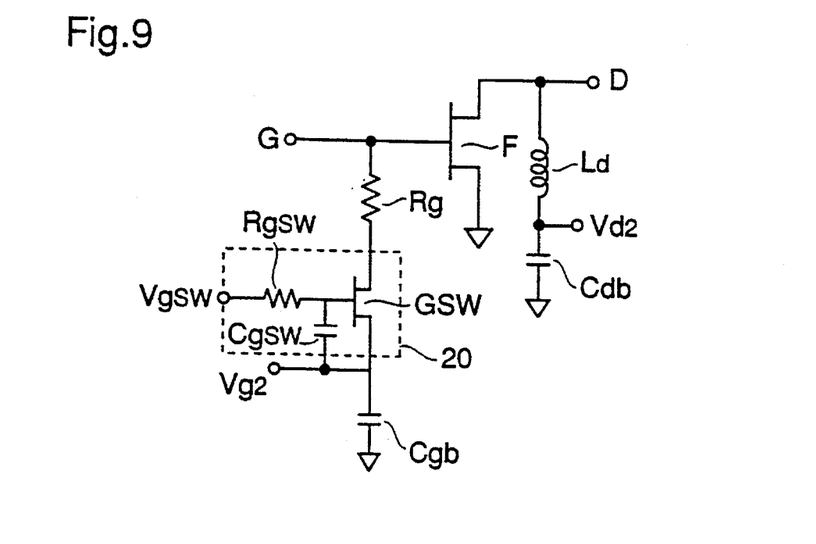
FIG. 9 is an equivalent circuit diagram illustrating an output amplifier stage A2 included in a power amplifier in accordance with a fourth embodiment of the invention.

In a fourth embodiment of the invention, the output amplifier stage A2 shown in FIG. 2 included in the power amplifier according to the first embodiment of the invention is replaced with an output amplifier stage having a circuit structure shown in FIG. 9.

In FIG. 9, the same reference characters as in FIG. 2 designate the same or corresponding elements. An FET switch 20 comprises a switch FET GSW for branching the gate bias voltage applied to the gate terminal G (hereinafter referred to as a gate bias branching switch FET), a resistor Rgsw, a switch FET bias capacitor Cgsw, and a control terminal Vgsw for controlling the gate bias branching (hereinafter referred to as a gate bias branching control terminal). A drain of the gate bias branching switch FET GSW is connected to an end of the gate stabilizing resistor Rg. The other end of the resistor Rg is connected to a junction of the gate terminal G and the amplifier FET F. A gate of the gate bias branching switch FET GSW is connected through the high resistor Rgsw to the gate bias branching control terminal Vgsw, and a junction of the gate and the high resistor Rgsw is connected through the switch FET bias capacitor Cgsw to the gate bias terminal Vg2. A source of the gate bias branching switch FET GSW is connected to an end of the gate bias capacitor Cgb, and a junction of the source and the gate bias capacitor Cgb is connected to a junction of the switch FET bias capacitor Cgsw and the gate bias terminal Vg2.

In the power amplifier including the output amplifier stage A2 shown in FIG. 2 according to the first embodiment of the invention, if the input impedance on the output amplifier stage A2 side is considerably low compared to the input impedance on the output amplifier stage A3 side when the resistance of the gate stabilizing resistor Rg for the amplifier FET of the output amplifier stage A2 is low and the output power is low, i.e., when the output amplifier stage A3 is operated and the amplifier FET constituting the output amplifier stage A2 is pinched off, most of the signal output from the driver stage A1 flows toward the output amplifier stage A2, so that the signal output is hardly applied to a output amplifier stage A3. As the result, an expected operation cannot be realized. The fourth embodiment of the invention is directed to solving this problem. More specifically, in the power amplifier of this fourth embodiment, since the output amplifier stage A2 has the circuit structure shown in FIG. 9, the input impedance on the output amplifier stage A2 side can be increased by turning off the gate bias branching switch FET 20. Therefore, while the low-power output operation, i.e., while the output amplifier stage A3 is operated and the amplifier FET constituting the output amplifier stage A2 is in the pinch-off state, by turning off the gate bias branching switch FET GSW, the signal output from the driver stage A1 is input to the output amplifier stage A3 with high reliability, resulting in a stable low-power output operation. If the voltage at the gate bias branching control terminal Vgsw is equivalent to the voltage at the gate bias terminal Vg2, the gate bias branching switch FET GSW is turned on. If the voltage at the gate bias branching control terminal Vgsw is sufficiently negative compared to the voltage at the gate bias terminal Vg2, the gate bias branching switch FET GSW is turned off.

As described above, according to the fourth embodiment of the invention, since the FET switch 20 for branching the gate bias is included in the gate bias circuit for the amplifier FET (F) constituting the output amplifier stage A2, even when the input impedance is lower on the output amplifier stage A2 side than on the output amplifier stage A3 side because of the low resistance of the gate stabilizing resistor Rg of the amplifier FET, the input impedance on the output amplifier stage A2 side can be increased by turning off the gate bias branching switch FET 20, whereby the signal output from the driver stage A1 is input to the output amplifier stage A3 with high reliability, resulting in a stable low-power output operation of the output amplifier stage A3.

While in the above-described first to fourth embodiments emphasis has been placed upon a power amplifier including two amplifier circuits with different output power levels, a similar power amplifier including three or more amplifier circuits with different output power levels is also within the scope of the present invention.

Embodiment 5.

Figure 10:
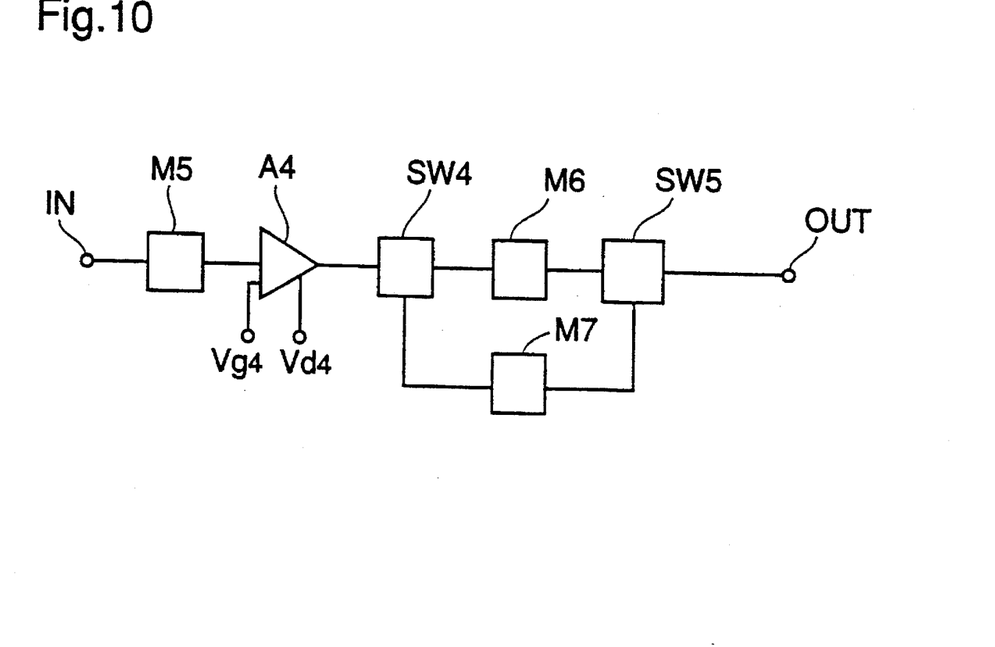
FIG. 10 is a block diagram illustrating a power amplifier in accordance with a fifth embodiment of the present invention.

FIG. 10 is a block diagram illustrating a power amplifier in accordance with a fifth embodiment of the present invention. In the figure, the same reference numerals as in FIG. 1 designate the same or corresponding parts. An input terminal IN is connected through a matching circuit M5 to an input end of an output amplifier stage A4 comprising an amplifier FET. An output end of the output amplifier stage A4 is connected to an input end of an FET switch SW4. The FET switch SW4 receives a signal from the output amplifier stage A4 and selectively outputs the signal toward one of matching circuits M6 and M7. An FET switch SW5 has two input ends which are respectively connected to output ends of the matching circuits M6 and M7. The FET switch SW5 receives a signal from either of the matching circuits M6 and M7 and outputs the signal to the output terminal OUT. The matching circuits M6 and M7 have different impedances.

Figure 11:
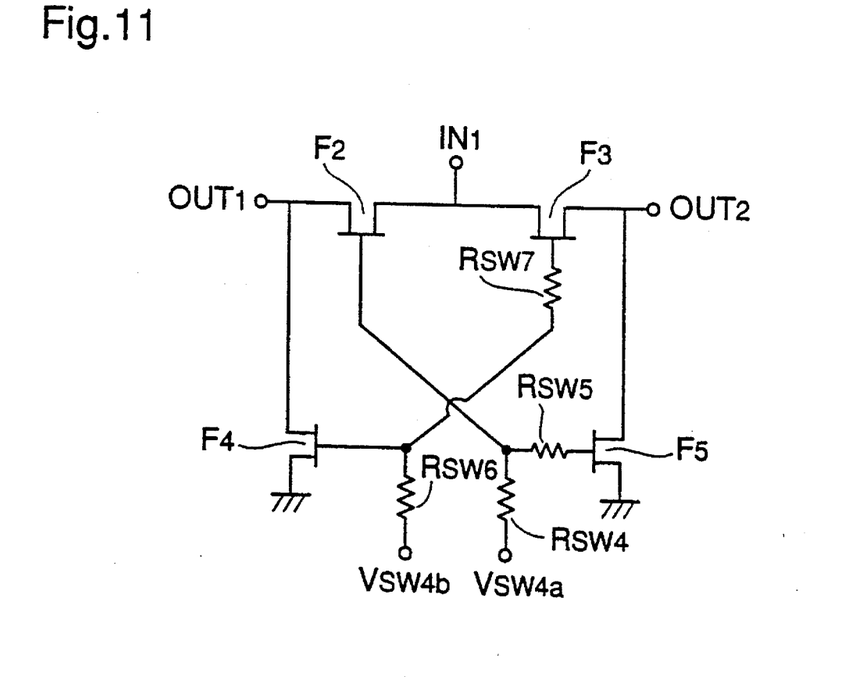
FIG. 11 is an equivalent circuit diagram illustrating an FET switch SW4 shown in FIG. 10.

FIG. 11 is an equivalent circuit diagram of the FET switch SW4. In the figure, an input terminal IN1 is connected to source or drain of an FET F2 and to source or drain of an FET F3. An output terminal OUT1 is connected to drain or source of the FET F2, and an output terminal OUT2 is connected to drain or source of the FET F3. The output terminal OUT1 is also connected to a drain of an FET F4 whose source is grounded, and the output terminal OUT2 is also connected to a drain of an FET F5 whose source is grounded. A gate of the FET F2 is connected through a resistor Rsw4 to a control terminal Vsw4b and through a resistor Rsw5 to a gate of the FET F4. A gate of the FET F3 is connected through a resistor Rsw6 to a control terminal Vsw4b and through a resistor Rsw7 to a gate of the FET F4. The FETs F2, F3, F4, and F5 perform ON/OFF switching at the same gate voltage level.

Figure 12:
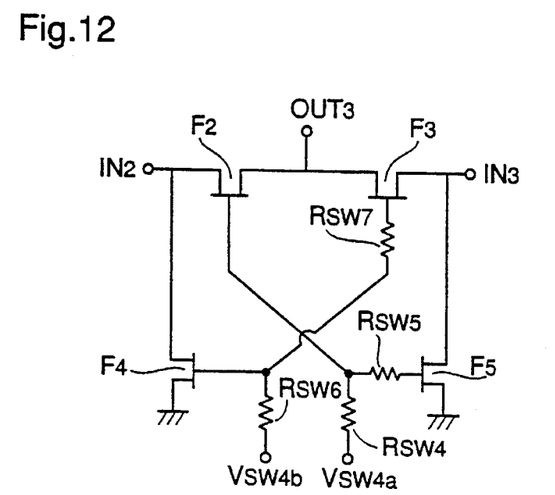
FIG. 12 is an equivalent circuit diagram illustrating an FET switch SW5 shown in FIG. 10.

FIG. 12 is an equivalent circuit diagram of the FET switch SW5. In the figure, the same reference numerals as in FIG. 10 designate the same or corresponding parts, and characters IN2 and IN3 denote input terminals and a character OUT3 denotes an output terminal. The circuit structure of the FET switch SW5 is identical to the FET switch SW4 shown in FIG. 10 except that the input terminal IN1 is replaced with the output terminal OUT3 and the output terminals OUT1 and OUT2 are replaced with the input terminals IN2 and IN3, respectively.

In the above-described first to fourth embodiments of the present invention, the power amplifier comprises the first and second amplifier circuits 100a and 100b, and the first amplifier circuit 100a includes the output amplifier stage A2 comprising the first amplifier FET and outputs a high-power level output by the high-efficiency operation thereof while the second amplifier circuit 100b includes the output amplifier stage A3 comprising the second amplifier FET having a gate width narrower than that of the first amplifier FET and outputs a low-power level output by the high-efficiency operation thereof. These first and second amplifier circuits 100a and 100b are selectively operated to improve the efficiencies in both the high-power output operation and the low-power output operation. However, the power amplifier according to this fifth embodiment of the invention is not for improving the efficiencies in the high-power output operation and the low-power output operation which have a considerable difference in the output power. In the power amplifier of this fifth embodiment, when a power supply voltage, i.e., a gate bias voltage or a drain bias voltage, applied to an amplifier FET constituting a single output amplifier stage is controlled to control the amplified output from the output amplifier stage, the impedance of the output side matching circuit of the output amplifier stage is adjusted to an optimum value in response to the power level of the amplified output. Therefore, even when the power level of the amplified output varies, the amplified output is always obtained by the high-efficiency operation.

A description is given of the operation.

An input signal applied to the input terminal IN is transmitted through the matching circuit M5 to the output amplifier stage A4. The output amplifier stage A4 has a circuit structure as shown in FIG. 2 in which the gate bias terminal Vg4 corresponds to the gate bias terminal Vg2 and the drain bias terminal Vd4 corresponds to the drain bias terminal Vd2. By controlling power supply voltages applied to the gate bias terminal Vg4 and the drain bias terminal Vd4, the output amplifier stage A4 output amplified outputs of different power levels. It is assumed that the power level of the amplified output is changed from P1 to P2 (P1>P2). When the power level of the amplified output is P1, the matching circuit M6 is selected by the FET switches SW4 and SW5 and the amplified output is transmitted through the matching circuit M6 whose impedance is adjusted so that the optimum impedance match is made when the output power level is P1, to the output terminal OUT. On the other hand, when the power level of the amplified output is P2, the matching circuit M7 is selected by the FET switches SW4 and SW5 and the amplified output is transmitted through the matching circuit M7 whose impedance is adjusted so that the optimum impedance match is made when the output power level is P2, to the output terminal OUT.

In the FET switch SW4, the input terminal IN1 is connected to the output end of the amplifier stage A4, and the output terminals OUT1 and OUT2 are connected to the matching circuit M6 and the matching circuit M7, respectively. In the FET switch SW5, the input terminals IN2 and IN3 are connected to the matching circuit M6 and the matching circuit M7, respectively, and the output terminal OUT3 is connected to the output terminal OUT. When the FETs F2 and F5 are turned on and the FETs F3 and F4 are turned off by controlling voltages applied to the control terminals Vsw4a and Vsw4b, a signal output from the amplifier stage A4 and input to the input terminal IN1 is transmitted through the matching circuit M6 to the output terminal OUT. On the other hand, when the FETs F2 and F5 are turned off and the FETs F3 and F4 are turned on, the signal input to the input terminal IN1 is transmitted through the matching circuit M7 to the output terminal OUT.

According to the fifth embodiment of the present invention, the amplified output from the output amplifier stage A4 is transmitted through the impedance matching circuit in which an optimum impedance match in response to the power level of the amplified output is achieved, to the output terminal OUT. Therefore, not in a case where the power level of the amplified output is changed from 1 W to 10 mW or 100 mW, i.e., changed by several hundreds of mW, as described in the first to fourth embodiments but in a case where the power level of the amplified output is changed by less than 100 mW by controlling the power supply voltage applied to the output amplifier stage A4, the efficiencies in both the high-power output operation and the low-power output operation can be improved.

When the power amplifier according to the first embodiment is combined with the power amplifier according to the fifth embodiment, i.e., when the circuit structure of the power amplifier according to the fifth embodiment is applied to the first and second amplifier circuits 100a and 100b according to the first embodiment, not only the efficiencies in the high-power output operation and the low-power output operation with a small difference in power levels but also the efficiencies in the high-power output operation and the low-power output operation with a large difference in the power levels are improved.

While in the above-described fifth embodiment the power amplifier includes two matching circuits with different impedances on the output side of the output amplifier stage, the power amplifier may includes three or more matching circuits. In this case, each of the FET switches SW4 and SW5 is designed so that it selects one from three input and output lines.

What is claimed:

1. A power amplifier comprising:

an input terminal for receiving an input signal to be amplified;

an output terminal for supplying an amplified signal;

a first amplifier circuit connected between the input terminal and the output terminal and comprising 1) a first amplifier FET having an input end, an output end, and a first gate width, and 2) a first matching circuit having an input end and an output end, wherein the input terminal is connected to the input end of the first amplifier FET, the output end of the first amplifier FET is connected to the input end of the first matching circuit, and the output end of the first matching circuit is connected to the output terminal; and a second amplifier circuit connected between the input terminal and the output terminal and comprising 1) a second amplifier FET having an input end, an output end, and a second gate width, 2) a second matching circuit having an input end and an output end, and 3) a first switching circuit having an input end and an output end, wherein the input terminal is connected to the input end of the second amplifier FET, the output end of the second amplifier FET is connected to the input end of the second matching circuit, the output end of the second matching circuit is connected to the input end of the first switching circuit, and the output end of the first switching circuit is connected to the output terminal and wherein the first gate width is greater than the second gate width whereby said first amplifier circuit outputs an output signal of a first power level with high efficiency when the first amplifier FET is operated, the second amplifier FET is not operated, and the first switching circuit is electrically open and the second amplifier circuit outputs an output signal of a second power level with high efficiency when the first amplifier FET is not operated, the second amplifier FET is operated, and the first switching circuit is electrically closed.

2. The power amplifier of claim 1 wherein the first power level is larger than the second power level, said power amplifier further comprising:

a third matching circuit having an input end connected to the input terminal and an output end connected to the input end of the first amplifier FET; and a second switching circuit having an input end and an output end and a fourth matching circuit having an input end and an output end, the input end of the second switching circuit being connected to the input terminal, the output end of the second switching circuit being connected to the input end of the fourth matching circuit, and the output end of the fourth matching circuit being connected to the input end of the second amplifier FET, wherein the second switching circuit is turned off when the first amplifier FET is operated and turned on when the second amplifier FET is operated.

3. A power amplifier comprising:

an input terminal for receiving a signal to be amplified;

an output terminal for supplying an amplified signal;

a first amplifier circuit connected between the input terminal and the output terminal and comprising 1) a first amplifier FET having an input end add an output end, the first amplifier FET including an FET switch for branching a gate bias applied to the first amplifier FET and 2) a first matching circuit having an input end and an output end, wherein the input terminal is connected to the input end of the first amplifier FET, the output end of the first amplifier FET is connected to the input end of the first matching circuit, and the output end of the first matching circuit is connected to the output terminal; and a second amplifier circuit connected between the input terminal and the output terminal and comprising 1) a second amplifier FET having an input end and an output end, a second matching circuit having an input end and an output end, and a first switching circuit having an input end and an input end, wherein the input terminal connected to the input end of the second amplifier FET, the output end of the second amplifier FET is connected to the input end of the second matching circuit, the output end of the second matching circuit is connected to the input end of the first switching circuit, and the output end of the first switching circuit is connected to the output terminal, whereby the first amplifier circuit outputs an output signal of a first power level with high efficiency when the first amplifier FET is operated, while the second amplifier FET is not operated, and the first switching circuit is electrically open, and said second amplifier circuit outputs an output signal of a second power level, lower than the first power level, with high efficiency when the first amplifier FET is not operated, while the second amplifier FET is operated and the first switching circuit is electrically closed.

4. The power amplifier of claim 1 further comprising:

a fourth switching circuit connected between the input terminal and the input end of the first amplifier FET, the fourth switching circuit being active when the first amplifier FET is operated and being inactive when the second amplifier FET is operated.

5. A power amplifier comprising:

an input terminal for receiving an input signal to be amplified;

an output terminal for supplying an amplified signal;

an amplifier FET for receiving the input signal from the input terminal, amplifying the input signal, and outputting an amplified signal having a power level;

a plurality of matching circuits, each matching circuit having a different impedance, each matching circuit having an input end and an output end;

a first switching circuit connected to the input ends of the plurality of matching circuits for selecting one of the plurality of matching circuits in response to the power level of the amplified signal and connecting the amplifier FET to the input end of the selected matching circuit, the selected matching circuit providing for high-efficiency operation of the amplifier FET; and a second switching circuit connected to the output ends of the plurality of matching circuits for selectively connecting the output end of the selected matching circuit to the output terminal.

6. The poor amplifier of claim 1 wherein the first amplifier FET includes a plurality of FET cells.

7. The power amplifier of claim 1 wherein the second amplifier FET includes a plurality of FET cells.

* * * * *

UNITED STATES PATENT AND TRADEMARK OFFICE
CERTIFICATE OF CORRECTION

PATENT NO. :   5,548,246
DATED      :   August 20, 1996
INVENTOR(S) :  Yamamoto et al.

It is certified that error appears in the above-indentified patent and that said Letters Patent is hereby corrected as shown below:

```
Column 15, Line 64, change "add" to --and--;

Column 16, Line 60, change "poor" to --power--.
```

Signed and Sealed this

Fourteenth Day of January, 1997

Attest:

BRUCE LEHMAN

Attesting Officer    Commissioner of Patents and Trademarks